United States Patent [19]
Papadimitrakopoulos

[11] Patent Number: 5,946,550
[45] Date of Patent: Aug. 31, 1999

[54] SELF-ASSEMBLED SEMICONDUCTOR AND METHOD OF MAKING SAME

[75] Inventor: Fotios Papadimitrakopoulos, Coventry, Conn.

[73] Assignee: University of Connecticut, Storrs, Conn.

[21] Appl. No.: 08/818,382

[22] Filed: Mar. 14, 1997

[51] Int. Cl.[6] .............................. H01L 35/24; H01L 33/00; B23B 27/00
[52] U.S. Cl. .............................. 438/99; 257/40; 257/103; 257/918; 438/22; 438/478; 438/584; 438/758; 438/761; 438/780; 428/423.1; 428/424.2
[58] Field of Search .................................. 257/40, 82, 613, 257/103, 918; 252/500; 428/690, 917, 423.1, 424.2; 438/22, 99, 478, 584, 758, 761, 780; 528/423, 425, 491, 492, 485, 502 A

[56] References Cited

U.S. PATENT DOCUMENTS

| | | | |
|---|---|---|---|
| 4,833,232 | 5/1989 | Chiang | 528/423 |
| 5,364,654 | 11/1994 | Hosokawa et al. | 427/66 |
| 5,504,183 | 4/1996 | Shi et al. | 528/272 |
| 5,518,767 | 5/1996 | Rubner et al. | 427/259 |
| 5,599,935 | 2/1997 | Hiratani et al. | 546/101 |
| 5,681,659 | 10/1997 | Shi et al. | 428/480 |

*Primary Examiner*—Frank C. Eisenschenk
*Assistant Examiner*—Mary K Zeman
*Attorney, Agent, or Firm*—Pepe & Hazard LLP

[57] ABSTRACT

A method for producing a ultrathin semiconducting film, utilizes a substrate with a reactive functionalized surface which is contacted with a reactant compound of a divalent and trivalent chelating metal to produce a metallo-functionalized surface. The metallo-functionalized surface is contacted with a bisquinoline or a bisquinoline to produce a deposit of an oligomeric metallo-bisquinoline chelate, which is then contacted with the reactant metal compound to produce a fresh metallo-functionalized surface on the deposit. The fresh metallo-functionalized surface is contacted with the bisquinoline reactant to produce a further deposit of the oligomeric metallo-bisquinoline chelate, and these steps are repeated until a desired thickness of the deposit has been attained.

22 Claims, 8 Drawing Sheets

FIG. 1 SCHEMATIC LAYOUT OF THE SELF-ASSEMBLY GROWTH OF A (V) BASED LED, WITH METAL-OXIDE DOPED LAYERS

DEPENDENCE OF THE UV/VIS ABSORPTION VERSUS THE NUMBER OF COMPLETE DIP CYCLES. INSET ILLUSTRATES THE DEPENDENCE OF THE LAYERING WITH THE FILM THICKNESS AND ABSORPTION MAXIMUM AT 396.6 NM.

PHOTOLUMINESCENCE (SOLID LINE) AND
ELECTROLUMINESCENCE (BROKEN LINE) SPECTRA OF A
ZINC-BISQUINOLINE (ZnBq) SELF ASSEMBLED FILM AND
ITS DEVICE (ITO / ZnBq / Mg) RESPECTIVELY.

WIDE-ANGLE POWDER X-RAY DIFFRACTION OF ZnBq

SELF-ASSEMBLED SEMICONDUCTOR AND METHOD OF MAKING SAME

BACKGROUND OF THE INVENTION

The present invention relates to the formation of thin film semiconductors from organic metallic compounds.

Considerable research efforts in both industry and academia have been directed towards the development of new methodologies for fabricating ultra-thin organic or polymeric films of controlled architecture, high processability and robustness. Incorporation of these films in optoelectronic applications such as light emitting diodes impose additional requirements including semiconductor-purity and precise dimensional control.

Thermal evaporation of small molecules and oligomers has led to significant advances towards uniform films of controlled architecture, but morphological changes (such as crystallization) alter the structure of these films during operation of these devices. The natural ability of polymers to suppress such phase transitions requires purity and controlled multilayer design, easily attained on the other hand with low molecular weight evaporated organics.

Self-assembly has been explored as a way to control both the supramolecular and local structure. Polymers as well as small molecules have been self-assembled to yield uniform thin films for semiconductor applications. Poly(anions) with poly(cations) encompass current polymer self-assembly techniques. On the other hand, supramolecular film growth from small molecules has been achieved by self-assembly of zirconium organo-phosphonates, cobalt-diisocyanobenzenes, ruthenium pyrazines, and w-mercaptoalkanoic acids with copper or gold. Semiconductor applications including NLOs, dielectrics, photoluminescent, and photocharge generation have been demonstrated by both organo-phosphonates and polymers, although only the latter have produced electroluminescent devices.

Recent advances in organic light emitting diodes have established molecular-based light emitting diodes in the forefront for commercialization. 8-Hydroxyquinoline (8-Hq) chelates have been shown to be among the most promising of these materials for electron injection, in conjunction with triphenylamine or phenylenevinylene derivatives as hole injectors. The recent discoveries of white light emission, enhanced electroluminescence efficiency through molecular doping, and color-tuning through microcavity-based devices justify the increased interest towards commercialization of this technology. However, their performance and lifetime is significantly limited in applications demanding elevated temperatures or high brightness.

Considerable research efforts from both industry and academia have been directed towards the identification and prevention of the various failure mechanisms. Localized heating from non-ohmic contacts and film or ITO imperfections result in a number of physical and chemical transformations contributing to device degradation. Among the most prominent is the heat-activated crystallization of these organics, causing densification and large film thickness variations that lead to short-circuit failures. Polymers have been proposed as a natural avenue to overcome this problem. However, the inability to purify long molecules with incorporated defects within the chain, poses an insurmountable difficulty in attaining semiconductor purity.

Although vital advantages exist from the near-semiconductor purity of sublimed molecular organic materials as opposed to their polymeric counterparts, the cost benefits are not far superior to traditional chemical vapor deposited inorganics. The large vacuum chambers and uniform molecular beams required for both inorganics and sublimable organics, increase the costs exponentially with increasing device surface area. This presents an insurmountable barrier to the fabrication of large area electroluminescent (EL) displays and illuminators. Polymers, on the other hand, could be easily deposited from solutions to form uniform thin films (although the pin-hole density increases substantially as the film thickness decreases). This benefit is negated by the inherently low purity due to defects incorporated within the polymer chain. Optimization of carrier transport and radiative recombination is usually accomplished by successive n-type and p-type polymer layers. Unless the prior layer has been converted to an insoluble state, conventional spin- and dip-coating techniques are usually ineffective for depositing successive layers. The necessity for additional layers (such as hole or electron blocking and doped emissive layers) to achieve further performance enhancement quickly renders the polymer approach impractical.

The alternating spontaneous adsorption of monolayers of oppositely charged polymers, first introduced by Decher et al. in *Thin Solids Films* 1992, 210/211, 831 has been successfully utilized in fabricating complex superstructures of insulating, conducting and semiconducting multilayers as described by Fou et al in *Macromolecules* 1995, 28, 7115 and in *Appl. Phys.* 1996, 79, 7501 and by Cao et al in *Acc. Chem. Res.* 1992, 25, 420. Devices made from this self-assembly technique have shown remarkable film-forming uniformity and ability to manipulate a variety of alternatively charged polymers, molecular dyes and fullerenes. Although operational devices from as thin as 300 Å have been constructed, device efficiency and lifetime are still limited by purity issues associated with polymeric semiconductors.

The quest for polymer analogues of 8-hydroxyquinoline based metal-chelates (such as aluminum quinolate, etc.) has been a challenging task for development of electroluminescent structures. These metal chelate polymers are non-traditional polymers and usually entail considerable difficulties in handling. The principal intricacy arises from the complexation-decomplexation dynamics, which are very sensitive to the pH, ionic strength and solvating power of the solvent. Usually for linear metal chelate polymers, solublization (if any at all) can only occur in polar aprotic solvents. These solvents are difficult to remove from spun films. The insoluble and intractable nature of these polymers makes them amenable to a self-assembly growth that would be the subject of this paper.

It is an object of the present invention to provide a novel self-assembly method for generating ultra thin film semiconductor devices based upon a metallo-organic chelate.

It is also an object to provide such a method in which the thin film devices exhibit high purity and long life.

Another object is to provide such a method which can be conducted in either organic solvents or aqueous environments.

A further object is to provide novel ultra thin film semiconductor devices with complex exhibiting dimensional and thermal stability and relatively long life.

SUMMARY OF THE INVENTION

It has now been found that the foregoing and related objects may be readily attained in a method for producing a ultrathin semiconducting film, in which a substrate with a reactive functionalized surface is provided. This surface with a reactant compound of a chelating metal selected from the group consisting of divalent and trivalent metals to produce a metallo-functionalized surface. The metallo-functionalized surface is reacted with a bisquinoline compound selected from the group consisting of bisquinoline and bisquinoline telomers to produce a deposit of an oligomeric metallo-bisquinoline chelate having the general formula:

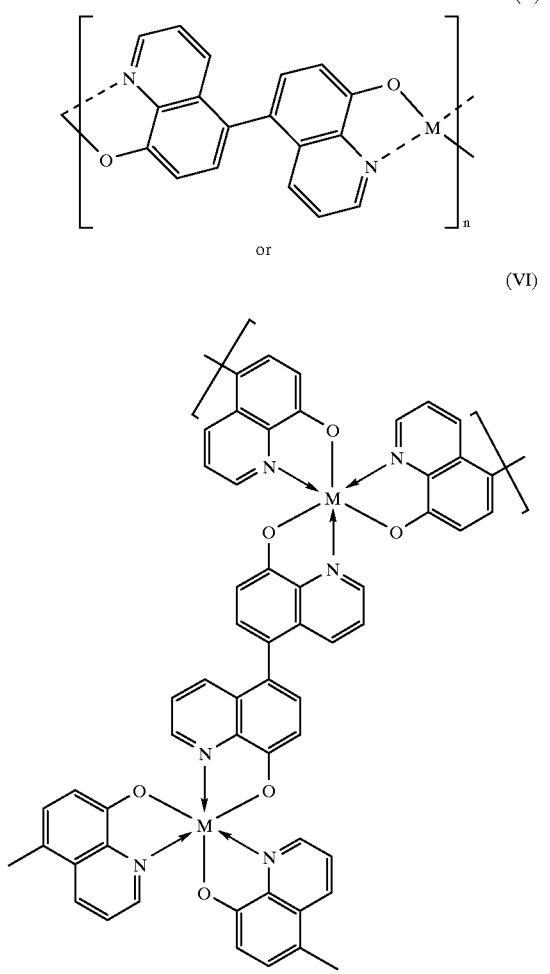

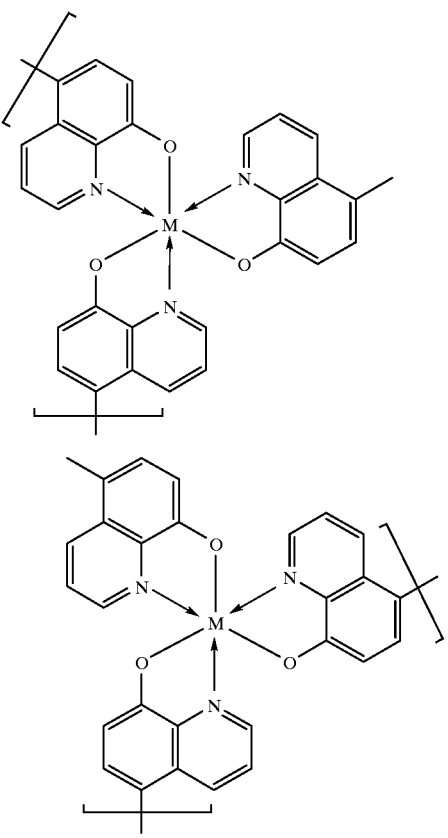

This surface is then reacted with the reactant compound to produce a fresh metallo-functionalized surface. The metallo-functionalized surface is contacted with bisquinoline to produce a further deposit of the oligomeric metallo-bisquinoline chelate. The metallic and bisquinoline treatment steps are repeated until the desired thickness of the deposit has been attained.

Preferably, the functional reactant is selected from the group consisting of hydroxyl, carboxyl, amino, and thio compounds which will react with the surface of the sustrate to develop a functionalized surface with an active group selected from the group consisting of hydroxyl, carboxyl, thio and amino. The chelating metal is selected from the group consisting of aluminum and zinc.

In one embodiment of the process, the chelating metal reactant compound is dissolved in an organic solvent, and the chelating metal reactant compound has the general formula $(CH_3–CH_2)_nM$.

In another embodiment, the chelating metal reactant compound is dissolved in water, and the chelating metal reactant compound has the general formula $Mx_y$. X is selected from the group consisting of halogens and carboxyls.

In a modification of the process, the chelating metal reactant compound is dissolved in an organic solvent and comprises a telomer of bisquinoline with the chelating metal adjacent the ends of the telomer chain. Similarly, the bisquinoline is a telomer of quinoline and chelating metal with quinoline molecules at the ends of the telomer chain.

Desirably, the surface of the substrate and thereafter of the deposits is cleaned with solvent between each of the steps to remove excess reactants.

For various devices, the provided substrate has a base and metallic oxide layer thereon and upon which the film is deposited. The metallic oxide layer may be doped with a fluorescent dye, and the provided substrate may also include a hole transporting layer between the base and the metallic oxide layer.

Usually, there is included the step of depositing on the film a metal deposit to provide one of a conductive layer for use as a diode and spaced stripes for use as a transistor.

A semiconducting device provided by the present invention includes a substrate and an ultrathin semiconducting film comprising elongated chains having a general formula selected from the group consisting of

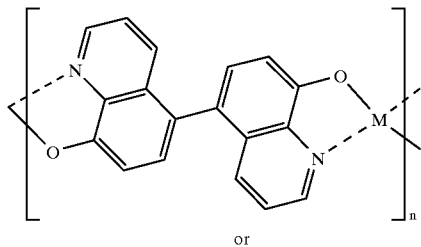

or (V)

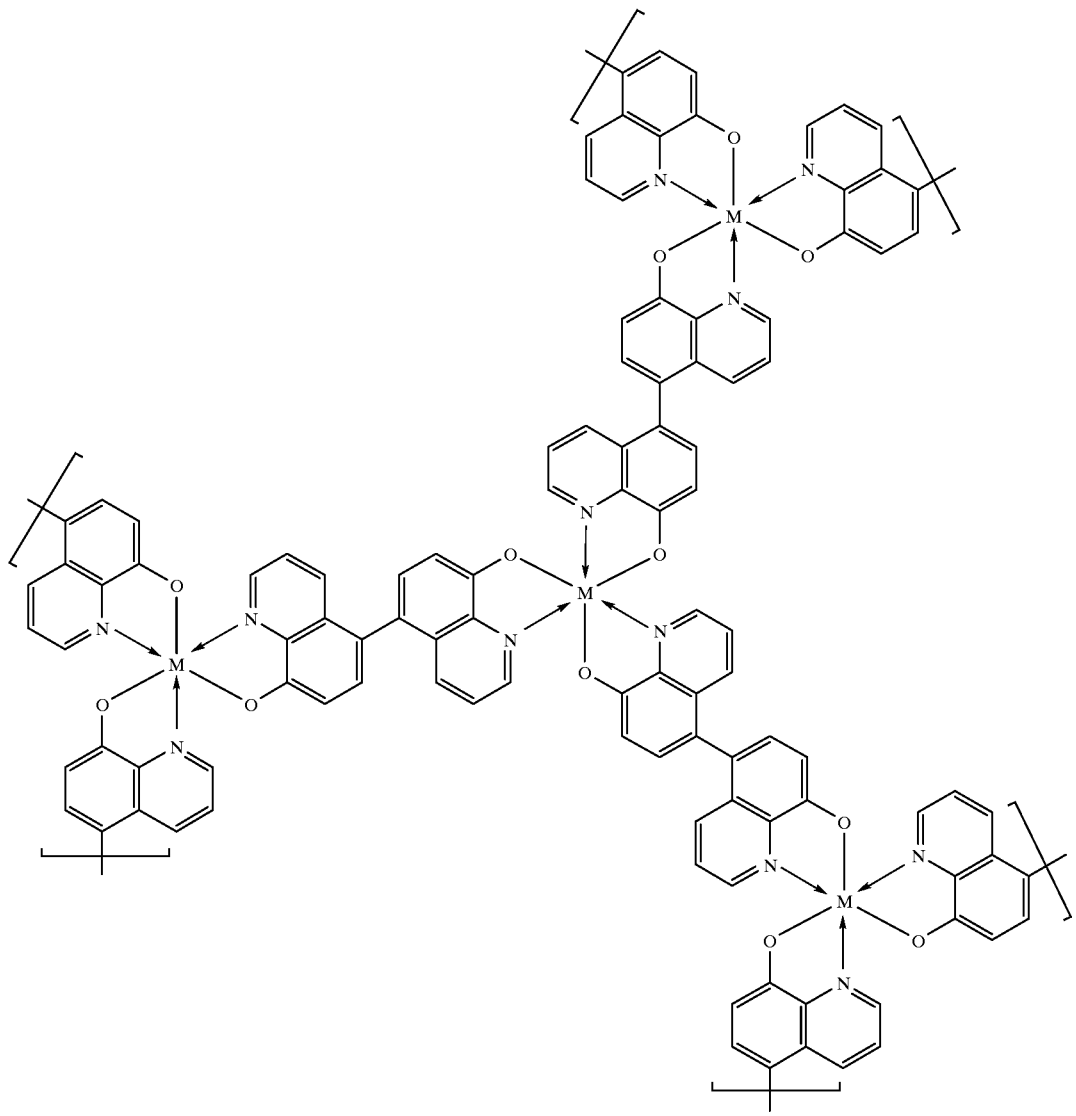

(VI)

In one embodiment, most of the length of the chains is in accordance with general formula (V) and a lesser portion of the chains is in accordance with general formula (VI). A conductive coating is usually provided on the outer surface of the device, and a conductive layer may be interposed between the substrate and the film. This layer may be doped with a fluorescent dye The conductive coating above the film may be a conductive metallic layer to provide a diode or spaced stripes of metal to provide a transistor.

DETAILED DESCRIPTION OF THE PREFERRED EMBODIMENTS

Figure 1:
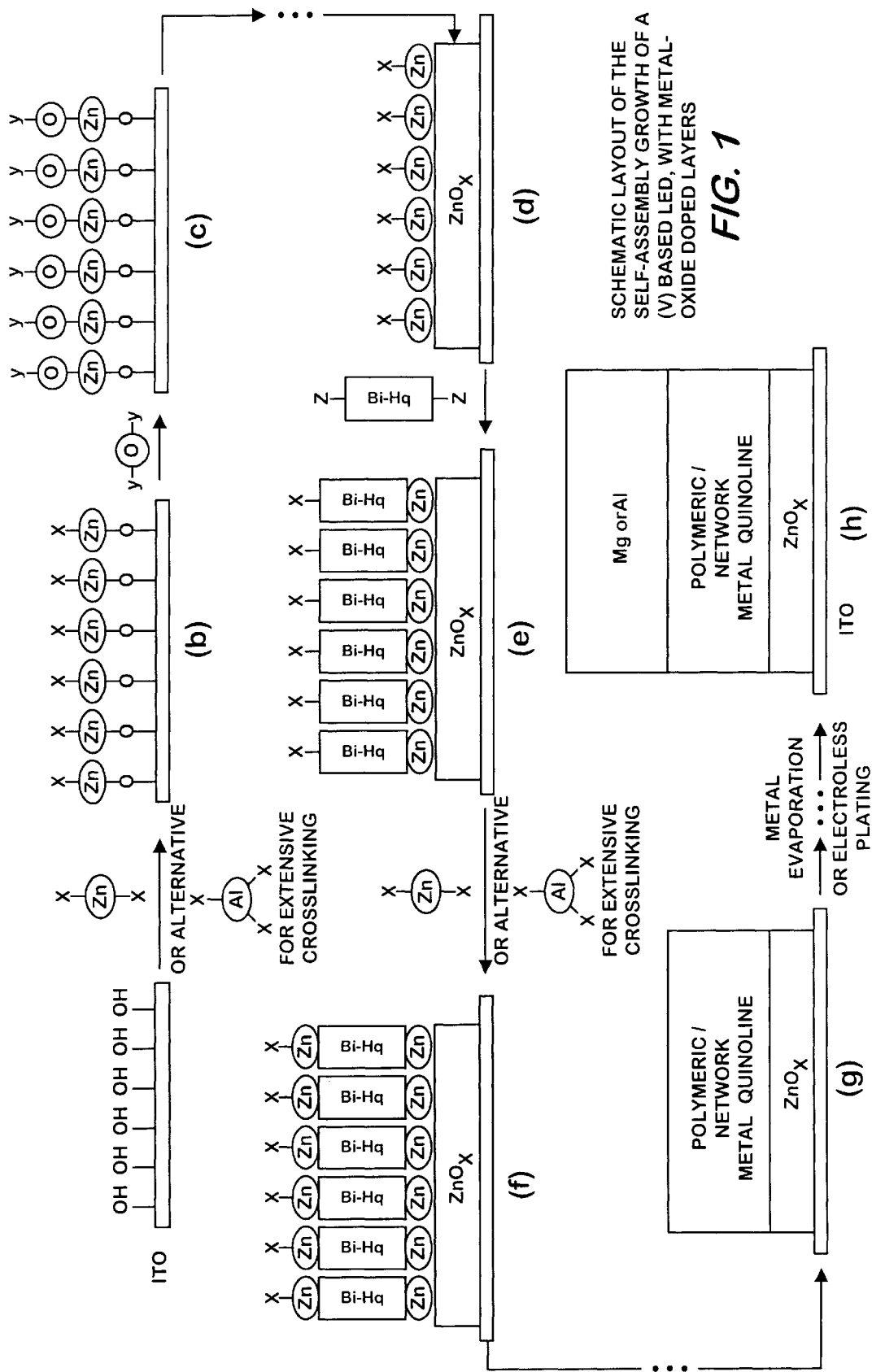
FIG. 1 is a schematic illustration of the steps in a process embodying the present invention.

In the process of the present invention, elongated chains or oligomers of metallo-bisquinoline chelates are formed on the surface of a substrate and are generally formed one chelate sequence at a time to provide precise control over the development of the thickness of the film and to minimize the entrapment of contaminants as well as to achieve a good structure essentially free from pinholes.

To achieve the desired film, 5,5'-bis (8-hydroxyquinoline) referred to herein as "bisquinoline" or "Bq" is the principal organic component and it is chelated by a divalent or trivalent metal.

Depending upon the valence of the metal to be used to form the chelate, the basic reactions and the resultant molecular sequences are as follows:

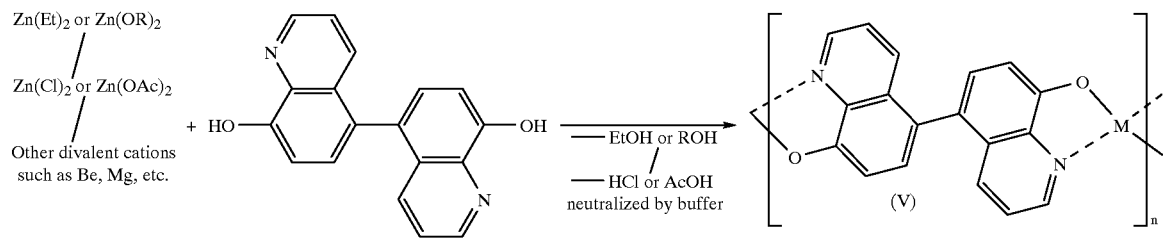

or

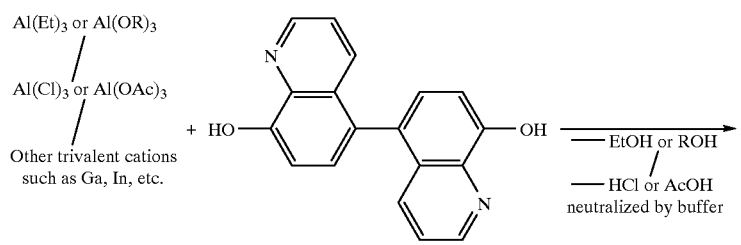

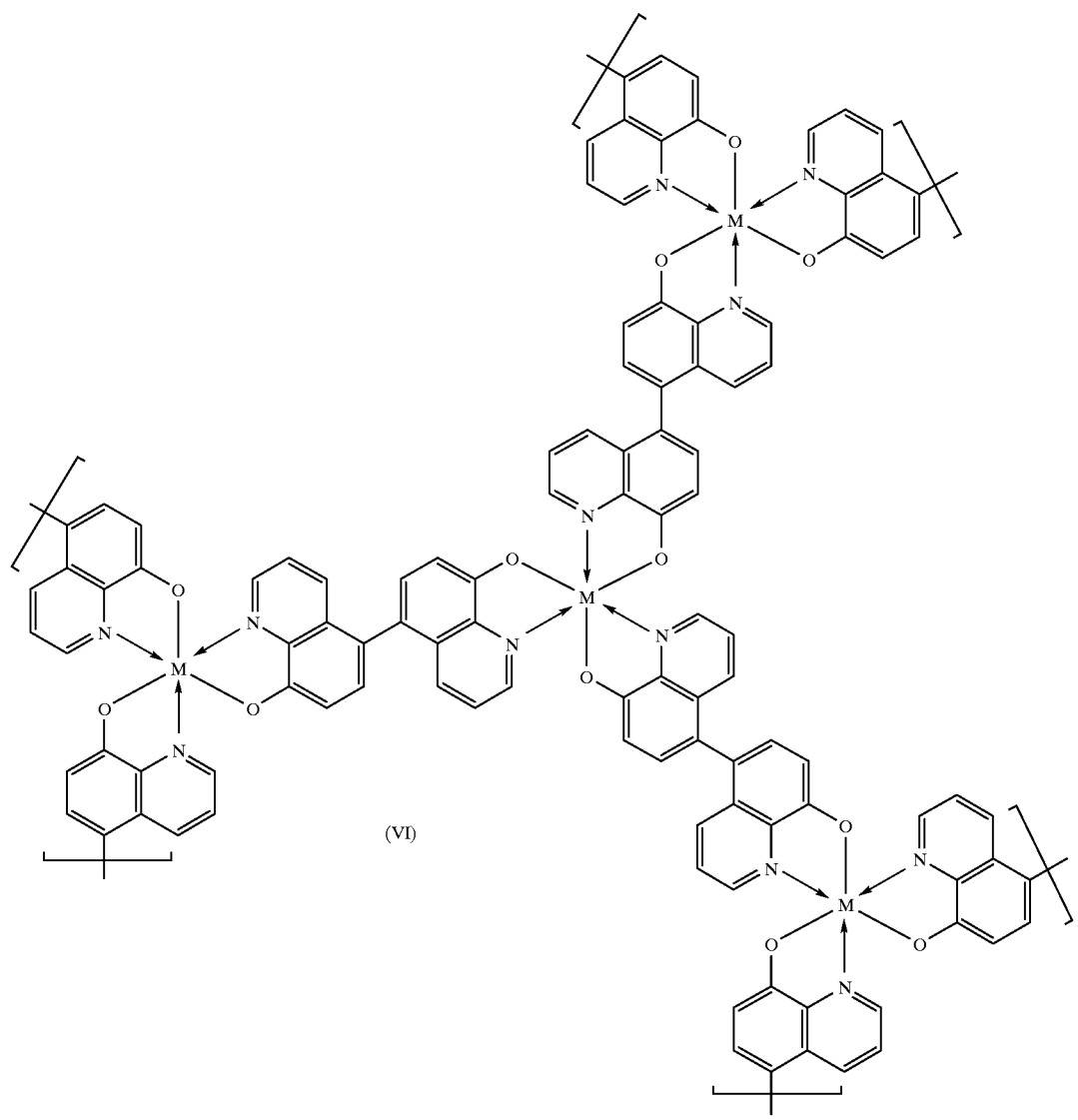

(VI)

The divalent metals which may be employed include zinc, beryllium and magnesium, with zinc being preferred. The trivalent metals which may be employed include aluminum, gallium and indium with aluminum being preferred. The nature of the metallic compound will depend upon whether the chelating reaction is being conducted in an organic or aqueous medium. The medium in which the reactions take place are polar solvents to solubilize the highly polar and self-associated multifunctional chelates. In an organic medium, oxygen and moisture contamination can be easily avoided. Suitable organic media include tetrahydrofuran, benzene, toluene and diphenyl ether.

In an organic medium, the metal component may be provided as suitable organo-metallic compounds such as diethyl zinc and triethyl aluminum. Alternatively, alkoxy salts of zinc and aluminum can be used.

In an aqueous medium, the metal may be provided as suitable salts, such as acetates and chlorides.

In order to develop the desired high purity deposit, all materials employed should be of high purity and preferably the media should be withdrawn and filtered during the repetitive steps employed to develop the desired thickness for the deposit. When an organic medium is employed, the organic wash medium may be continuously withdrawn and distilled in a configuration resembling a Soxhlet-type extractor The first steps in the process are to provide a clean substrate with an active functionalized surface. Suitable substrates include glass with an indium/tin oxide (ITO) deposit and silicon wafers. They should be thoroughly washed and air dried. An indium contact may be soldered to the cleaned surface for an anode connection. The functionalized surface is generally produced by treatment with concentrated sodium hydroxide solution, or hydrogen peroxide to generate a surface with —OH (hydroxyl) functionality.

Bisquinoline may be prepared as described by Archer et al in *Metal Containing Polymer Systems* at page 355 (Plenum Press, NY 1985) although only one DMF crystallization may be employed together with thoroughly argon-bubbled solvents. It may be stored, and purified by zone sublimation and should be kept away from exposure to moisture, oxygen and blue/UV light.

In the organic medium embodiments of the process, the functionalized substrate is first dipped in a solution of diethyl zinc or triethyl aluminum dissolved in tetrahydrofuran (THF) $10^{-2}$ space $UV^{-4}$ molar) for 1–2 minutes which produces an organometallic functionalized surface. The substrate is thoroughly rinsed in THF to remove any unreacted material. The substrate is then dipped in a solution of bisquinoline in THF ($10^{-2}$ (space) $10^{-4}$ molar) for 1–2 minutes to produce the chelate. Following a rinse in THF to remove unreacted material, the substrate is again dipped in the organometallic solution to provide a functional metal atom on the distal end of the chelate, rinsed, and immersed in the bisquinoline solution to add a new chelate group to that previously formed. This process is repeated until the thickness desired for the film is obtained.

In the aqueous version of the process using zinc as the chelating metal, high purity zinc choride or zinc acetate is dissolved in distilled and degassed water to provide a concentration of $10^{-2}$-(space)$10^{-4}$ concentration. The bisquinoline is also dissolved in distilled and degassed water to a concentration of about $10^{-2}$-(space)$10^{-4}$ molar. The pH in both reaction and solvent media is carefully controlled to promote complexation of zinc with bisqinoline and avoid precipitation of reactants or resolubilization of the grown layer. The substrate is dipped in the zinc solution for 5–10 minutes and rinsed in circulating distilled water for 5–10 minutes. The substrate is then dipped in the bisquinoline solution for 5–10 minutes, following which the substrate is rinsed and the process repeated to provide additional layers of the chelate until the desired thickness is obtained.

For diode applications, a metallic electrode contact or layer of aluminum, magnesium or silver can be assembled on the surface of the film by vacuum deposition. This also has the effect of sealing the surface to preclude oxidation and moisture degradation.

Recent experiments indicate that thicker layers in each dip may be produced by a variation of the process involving the use of telomer solution of metal quinolates. In this variation, a first telomer solution is generated by reacting 2 moles of diethyl zinc with one mole of bisquinodine in THF to produce a zinc quinolate corresponding to EtZn·Bq·ZnEt. Alternatively, a longer telomer solution such as EtZn·Bq·Zn·Bq·ZnEt may be generated by the reaction of 3 moles of diethyl zinc with 2 moles of bisquinoline, although elevated temperatures might be needed to keep it in solution. The reaction mixtures should be filtered to remove higher and more insoluble oligomers prior the self assembly process.

A second telomer solution is a/so generated by reacting 2 moles of bisquinoline and 1 mole of diethyl zinc to produce a zinc quinolate telomer corresponding to Bq·Zn·Bq. In the same fashion, a longer telomer solution such as Bq·Zn·Bq·Zn·Bq may be generated by the reaction of 3 moles of bisquinoline and 2 moles of diethyl zinc, although elevated temperatures might also be needed to keep it in solution. This reaction mixture should also be filtered to remove higher insoluble oligomers prior the self assembly process.

The dipping in the first solution adds the first telomer to the surface and provides the active metal atom site for reaction with the second telomer to add thereon. As a result, the dipping steps add larger chelate structures to increase the speed at which the desired film thickness may be obtained.

Generally, the films for the semiconductors (both light emitting diodes and transistors) will have a thickness varying from 100–3000 Angstroms.

By use of a trivalent metal chelate, cross linking between the growing chelate chains can be obtained to increase dimensional stability and packing. This cross linking and stabilization can be introduced into a divalent metal chelate by periodically interspersing dips into a trivalent metal solution to generate a trivalent metal functionality on the preceding layer.

Turning now to FIG. 1, therein diagrammatically illustrated is a process embodying the present invention for producing a zinc bisquinoline based LED with metal oxide layers for either tunneling or introduction of dopants. An ITO-surface substrate is first treated with sodium hydroxide or ammonium hydroxide to provide a hydroxy-functionalized surface which is then reacted with zinc to provide zinc functionality. Based on the zinc functionality, a zinc oxide or zinc bisquinoline semiconductor layer can be self assembled by reacting with water and/or bisquinoline and repeating this cycle for a sufficient number of times to provide the desired layer thickness. Subsequently, metal evaporation (Mg, Ag, Al, etc.) or electroless plating will provide the top contact or cathode for the zinc bisquinoline-based LED Doping of the zinc oxide semiconducting layer with an organic or inorganic based fluorescent dye would provide the LED structure of FIG. 3.

Figure 2:
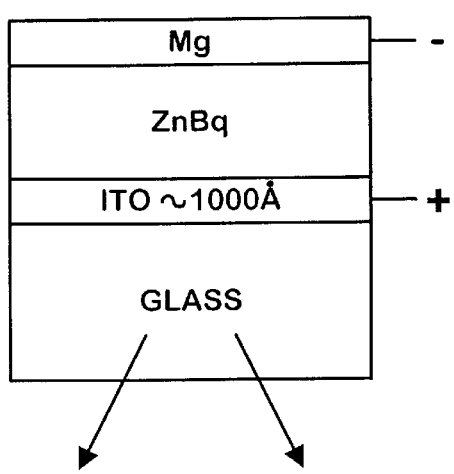
FIGS. 2–5 where a diagrammatical illustrations are diodes which utilize a zinc bisquinoline layer produced in accordance with the present invention.

Turning next to FIGS. 2–5, therein illustrated are a series of different structures for diodes which utilize the present invention. In FIG. 2, the substrate is glass and has deposited thereon a thin layer of indium/tin oxide on the order of 1000–3000 Angstroms. This oxide layer is exposed to diethyl zinc to provide a zinc functionality to the surface which is then placed in the bath containing the bisquinoline to subsequently develop a bisquinoline layer. This process is repeated until the desired thickness has been reached, after which a conductive layer of metal such as magnesium, aluminum or silver is deposited. As can be seen, this results in a diode wherein the emissions exit through the glass substrate.

Figure 3:
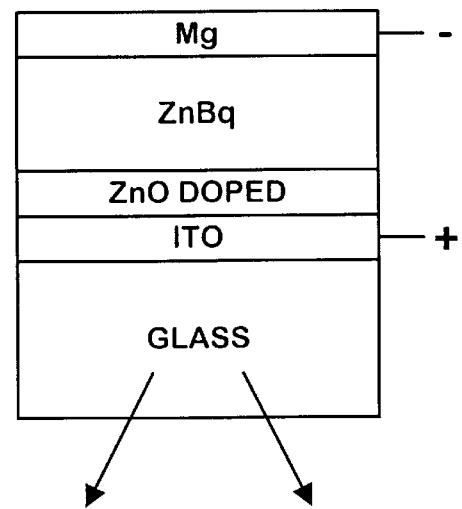

In FIG. 3, a metallic oxide layer containing a fluorescent dye is formed on the indium/tin oxide surface by, e.g., self-assembly in solutions of diethyl zinc and $H_2O$ light doped with a fluorescent dye.

Figure 4:
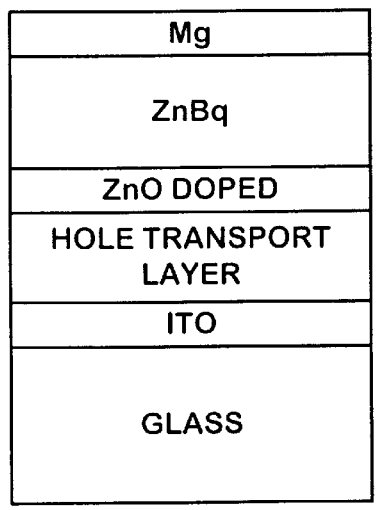

In FIG. 4, the structure of FIG. 3 is further modified by initially depositing a hole transporting layer of a resin such as poly(-phenylenevinylene) or a crosslinked poly(vinyl carbazole).

Figure 5:
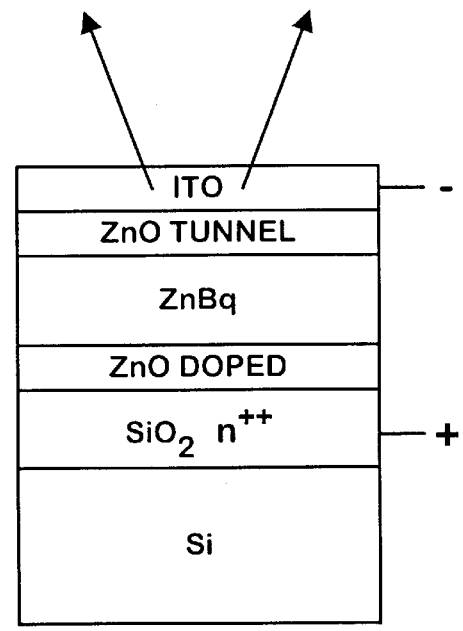

Lastly, in the version of FIG. 5, a silicon substrate is treated to produce a silicon oxide layer upon which is deposited a metallic oxide layer containing a fluorescent dye. The desired thickness of the zinc quinolate layer is then developed thereon by the method steps of exposure to the zinc and bisquinoline reactants. Upon this semiconducting film is deposited an insulating layer of zinc oxide, aluminum oxide or the like, and lastly there is formed on the top surface a conductive layer of indium/tin oxide which is transparent. In this embodiment, the photons exit through the indium/tin oxide layer.

Figure 6:
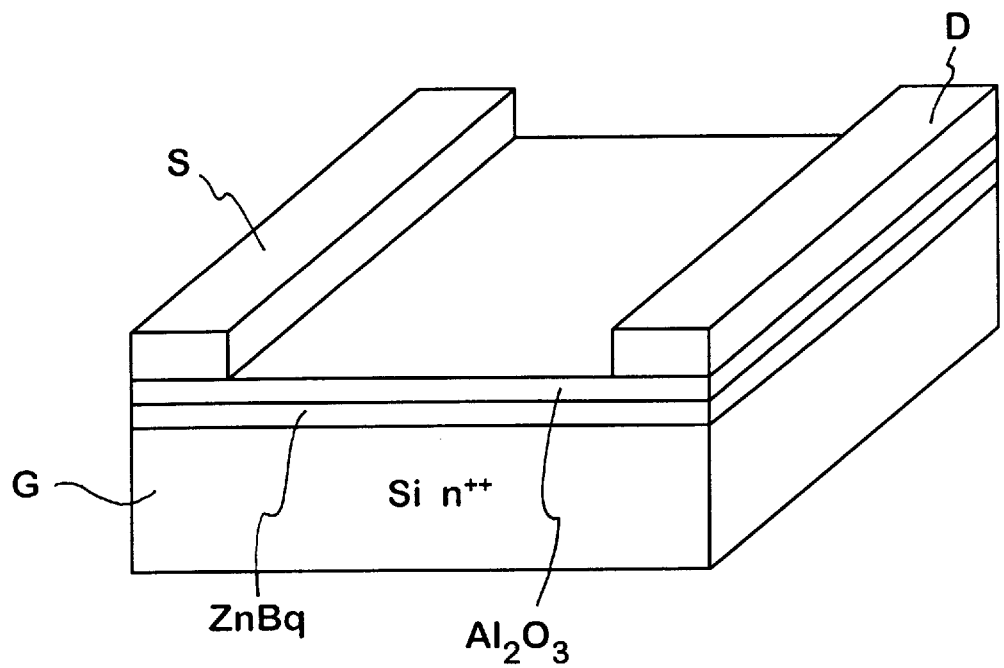
FIGS. 6 and 7 are diagrammatical illustrations of transistors utilizing a zinc bisquinoline layer in accordance with the present invention.
Figure 7:
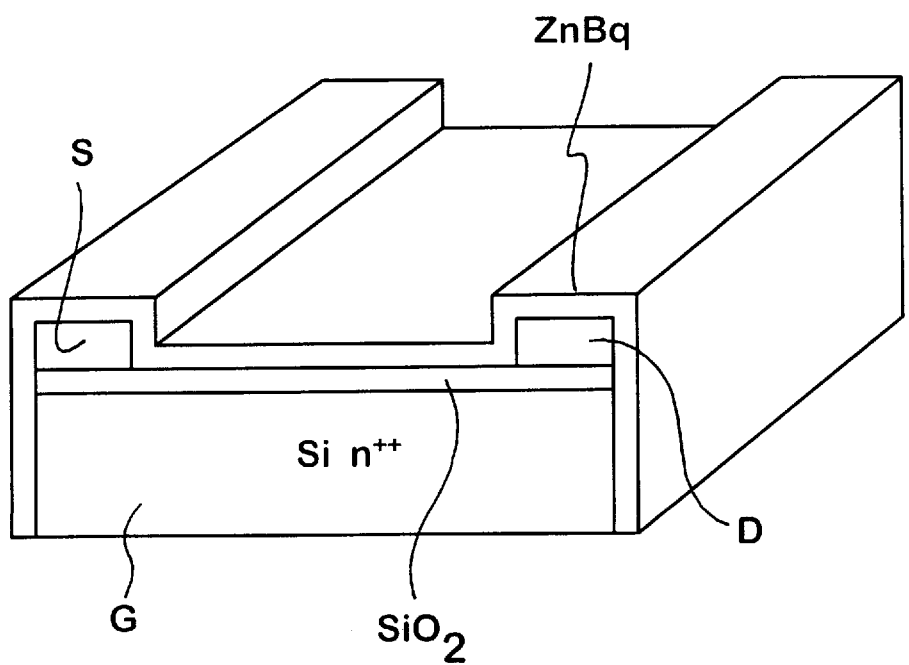

Turning now to FIGS. 6 and 7, therein illustrated are two transistors produced by use of the method of the present invention. In FIG. 6, a silicon substrate functions as the gate and zinc bisquinolate film is formed in accordance with the present invention. Upon this is formed a thin layer of aluminum oxide and then there are deposited two conductive stripes to function as the source and drain.

In the embodiment of FIG. 7, again there is a silicon substrate functioning as the gate upon which is formed a thin layer of silicon dioxide as an insulator. Two stripes of metal are provided upon its surface to function as the source and drain. There is deposited thereover a film of the metallic bisquinolate of the present invention so that current must flow therethrough. In order to make the device operative, the film of the metallic bisquinolate needs to be pierced above the source and drain to provide effective electrical contact.

Figure 8:
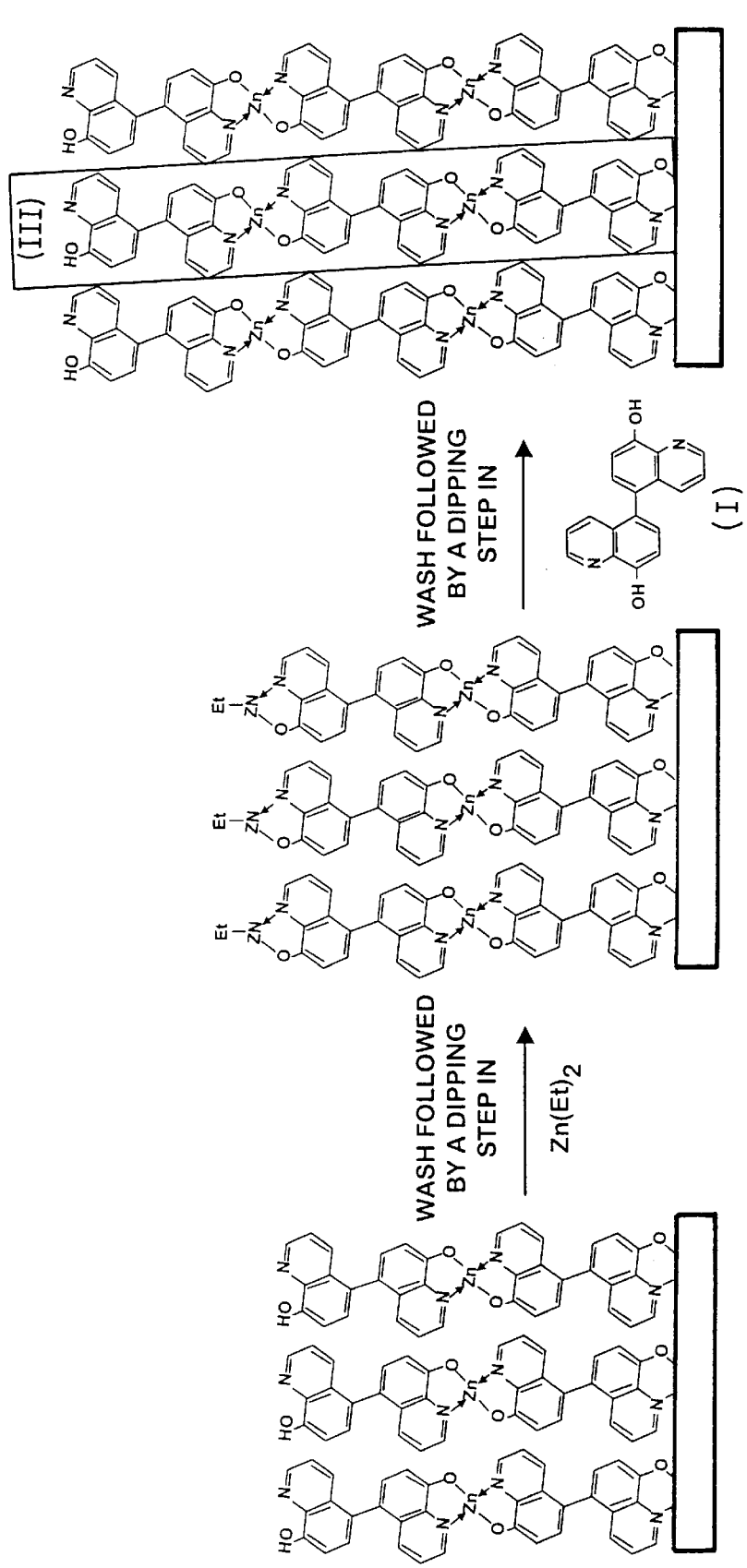
FIG. 8 is diagrammatical illustration of the growth of the zinc bisquinoline chains in accordance with the present invention.

Turning next to FIG. 8, there is diagrammatically illustrated the manner in which the film is formed. As seen in the first portion of this figure, a single chelate has been formed with exposed hydroxyl functionalities at the ends of the chelate chains. In the second portion of this figure, the hydroxyl groups have been reacted with zinc and, in the third portion, the zinc atoms have reacted with bisquinoline to add another chelate group, thus showing the elongation of the chain. This process is continued until the desired thickness for the film has been obtained.

Figure 9:
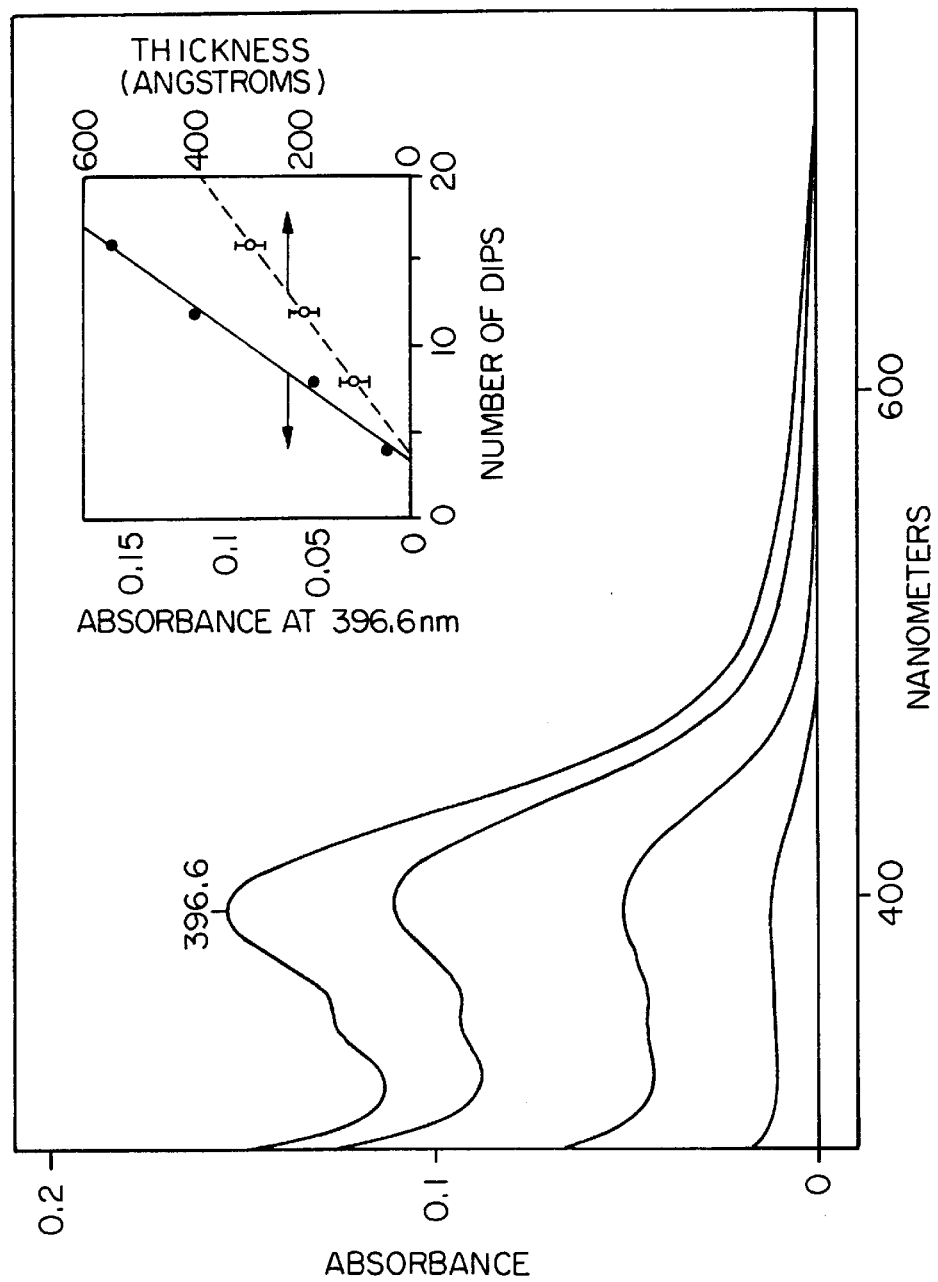
FIGS. 9–11 are graphic presentations of data relative to the structures produced of the present invention.

Turning now to FIG. 9, therein is illustrated the effect of increasing the number of dips and the resultant thickness of the film on the absorption of ultraviolet/visible light.

Figure 10:
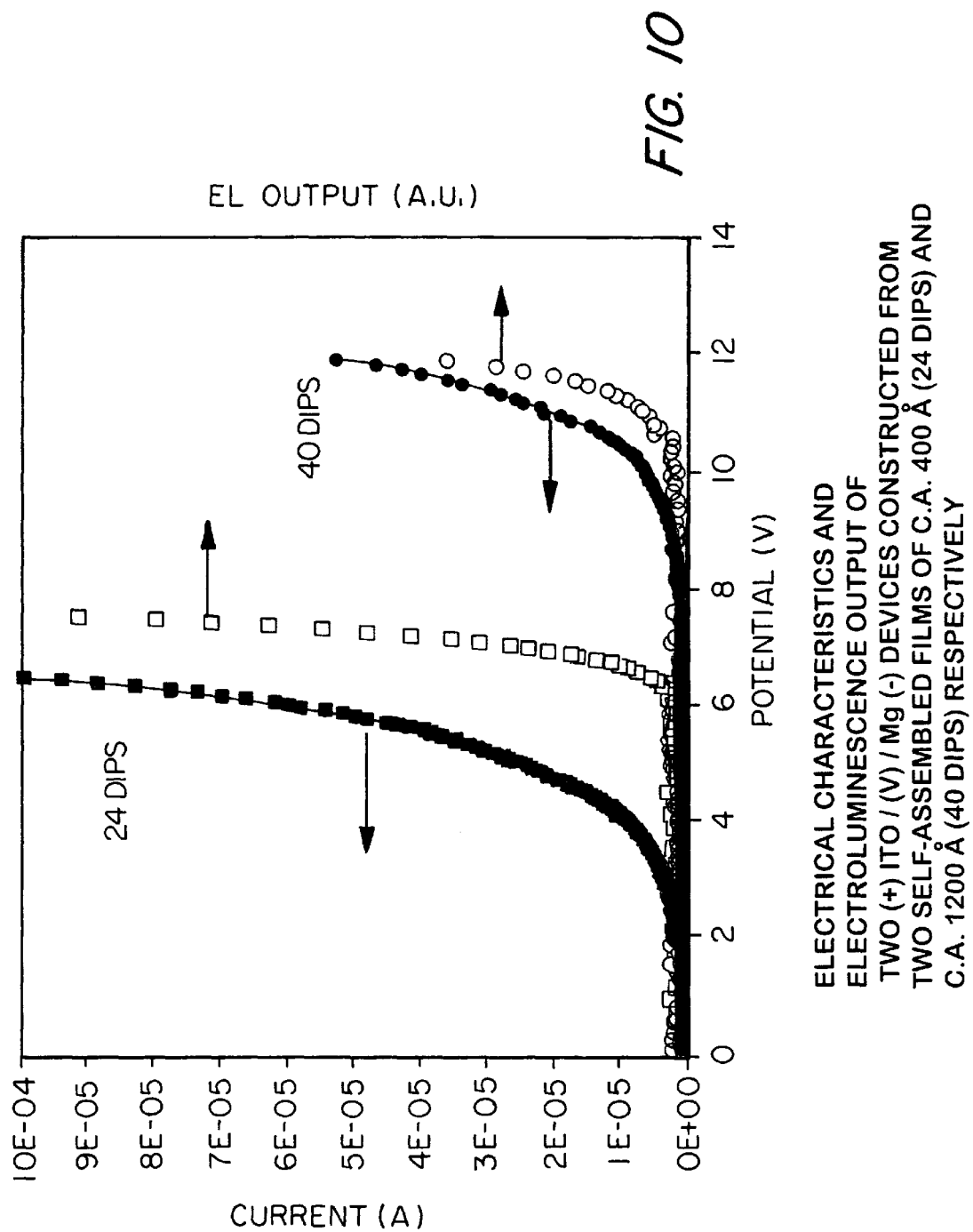

Turning next to FIG. 10, there is graphically illustrated the electrical characteristics and electroluminescence spectrum output of two electroluminescent devices constructed with an ITO anode, a zinc bisquinolate film, and a magnesium conductive layer as the cathode. In the first device, the thickness of the film is approximately 400 Angstroms resulting from 24 dip cycles and the film in the second device has a thickness of approximately 1200 Angstroms resulting from 40 dip cycles.

Figure 11:
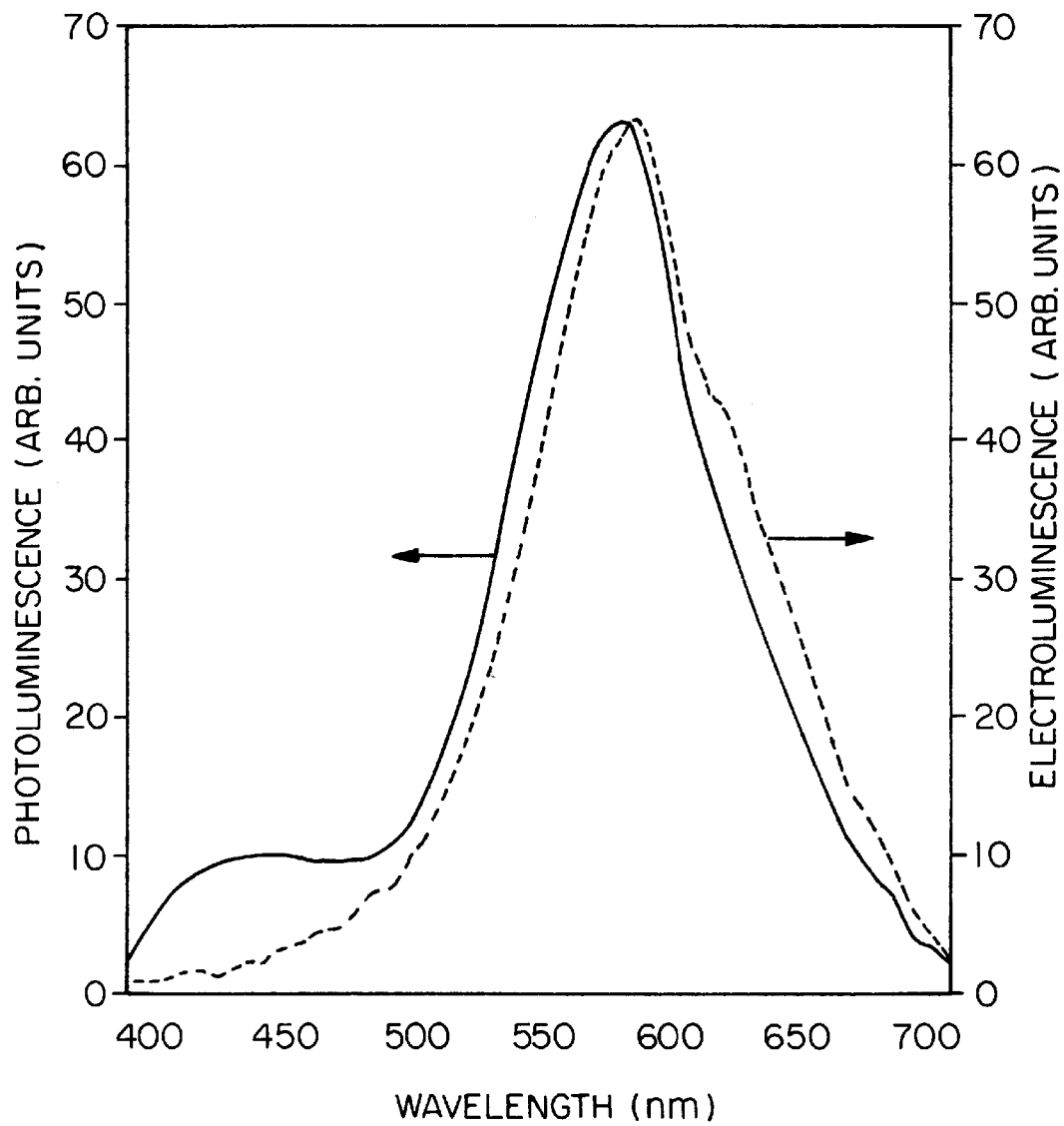

In FIG. 11 there are illustrated the photoluminescence in solid line and the electroluminescence in broken line of the device illustrated in FIG. 10.

This metal/bisquinoline molecular assembly shows promise in the ease of preparation of more sophisticated layers for device applications. Aluminum oxide ultrathin tunneling layers or zinc oxide semiconducting layers can be co-assembled onto ITO by a similar reaction using both the non-aqueous and aqueous techniques. Analogous to the electron-injecting bisquinoline-based self-assembly system, hole injecting layers can also be fabricated with this methodology. Introduction of $H_2O$ would also yield self-assembled ultrathin oxide films, frequently utilized as tunneling layers.

The versatility of this approach into the number of semiconducting/insulator layers inserted at command, allows tuning of the properties of these devices. For example, the concept of molecular doping could be easily incorporated within this methodology by dissolving a difunctional dye within the bisquinoline solution. An other important feature of this approach is color tuning ability. Considerable blue shifting could be achieved by placing a high band-gap inorganic or organic fluorophore within the ZnBq layer (n type) and on another p-type layer such as shown in FIGS. 3, 4 and 5. In addition, molecular doping could readily give a red shifted material to cover the entire visible spectrum.

Figure 12:
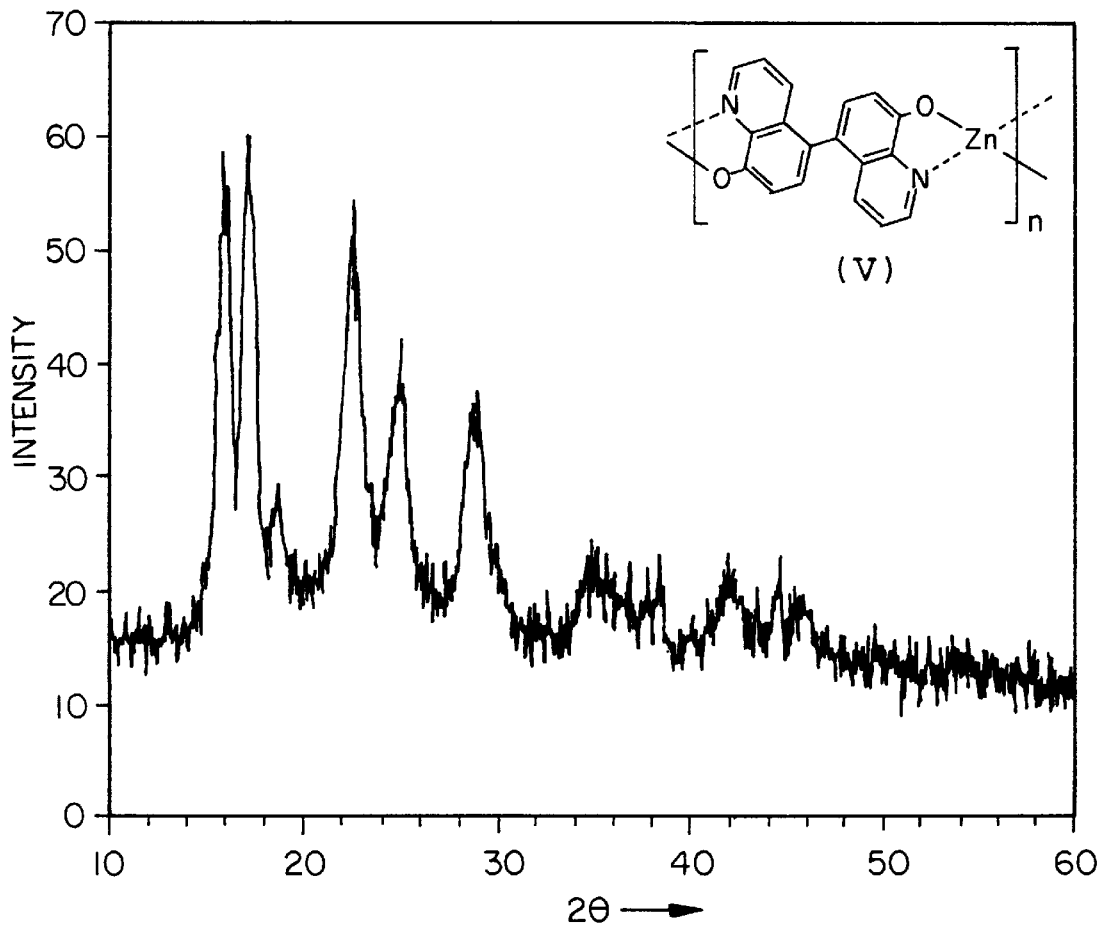
FIG. 12 is a graphic presentation of the X-Ray diffraction of zinc bisquinolate powder.

One of the more interesting aspects of this technique is the capability to form crystalline films (see FIG. 12). The rigidity of bisquinoline and the resulting polymer can provide highly crystalline and uniform films that could be extremely beneficial for the injection of a large amount of current and to achieve electrically pumped organic lasers. Electroluminescence experiments on a single layer self-assembled device indicated that these films could withstand 800 $mA/cm^2$ clearly approaching the inorganic analogs. Because most substrates have surface hydroxyl functionality, a vast number of assemblies can be done on a wide variety of materials: ZnS, GaP, NaCl, KBr, hydrophilic polymer films, conducting polymers, etc. The direct chemical bonding to the substrate, and the potential for high temperature film stability by dense crosslinking definitely promote many advantages for these systems. Also, the various shape conforming films with high uniformity are among the additional novelty of this approach.

Thus, the method of the present invention enables the facile manufacturing of polymeric quinoline-based light emitting diodes (LEDs) by self-assembly techniques. A number of benefits are associated with these polymeric quinolines which are not present in sublimed molecular systems, namely.

1) denser packing (quasi-one and three dimensional conjugated species)
2) direct chemical bonding to the substrate
3) high temperature film stability by dense crosslinking to emulate inorganic lattices
4) various shape conforming films with high uniformity
5) fabrication permitting the construction of very large size devices at any shape and complexity (even in a continuous form)
6) control of device color
7) control of the device structure and engineering
8) control of crystallinity (which is ultimately related to the current density achieved in organic LEDs and future organic based electrically pumped lasers)
9) control of auxiliary functional layers can be constructed in order to promote various device functionalities that permit performance optimization.

EXAMPLE ONE

A glove box equipped with a bath of tetrahydrofuran (THF) which is continuously circulated by a distillation procedure over chips of sodium metal is established. Solutions from $10^{-4}$ to $10^{-2}$ molar concentration of bisquinoline, and diethyl zinc ($ZnEt_2$) were made from tetrahydrofuran (THF) and placed in open beakers inside the glove box. Hydroxy-functionalized ITO coated substrates were at first dipped in the organometallic THF solution of $ZnEt_2$ for approximately two minutes, followed by a rinse in the THF bath for an equal amount of time. At the subsequent second half-circle, the polymer repeat is constructed by dipping the organometallic functionalized surface in the THF solution of bisquinoline for approximately two minutes followed by a THF rinse for an equal amount of time. In this fashion the layer thickness increases by cycling through this dipping sequence.

A 2000 Å magnesium electrode was vacuum deposited on the self-assembled film at $7.5 \times 10^{-6}$ torr base pressure and an evaporating rate of ca. 4 Å/sec utilizing an Edwards Auto-306 Vacuum Coater equipped with thickness monitors and a turbomolecular pump.

The voltage-current and electroluminiscence intensity characteristics of such LED devices are shown in FIG. 10, with the electroluminiscence spectrum of such devices being shown in FIG. 11.

Of significant interest is the apparent orientation of the segments in the chelate in perpendicular planes because of the high rigidity of the bisquinoline moiety. This orientation presents what might be a quasi-crystalline structure to provide enhanced stability as the film is being assembled.

The controlled formation of the layers effectively eliminates the pinholes found in other forms of deposition; these are highly disadvantageous in diode fabrication since the current flow is perpendicular to the substrate. Although pinholes are of lesser concern in transistors where the current flow is parallel to the substrate, the uniformity of the deposit is believed to produce superior operating characteristics.

As will be readily appreciated, the semiconducting films generated by the present invention may be utilized for a number of applications including light emitting diodes, transistors and electroluminescent panels. The electrodes and contacts for such applications may be provided by known techniques.

Having thus described the invention, what is claimed is:

1. A method for producing a ultrathin semiconducting film, the steps comprising:
   (a) providing a substrate with a reactive functionalized surface;
   (b) contacting said reactive functionalized surface with a reactant compound of a chelating metal selected from the group consisting of divalent and trivalent metals to produce a metallo-functionalized surface;
   (c) contacting said metallo-functionalized surface with bisquinoline compound selected from the group consisting of bisquinoline and telomers of bisquinoline to produce a deposit of an oligomeric metallo-bisquinoline chelate having a general formula selected from the group consisting of

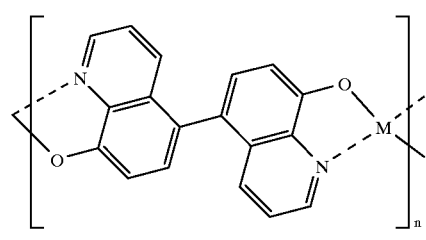

(V)

or

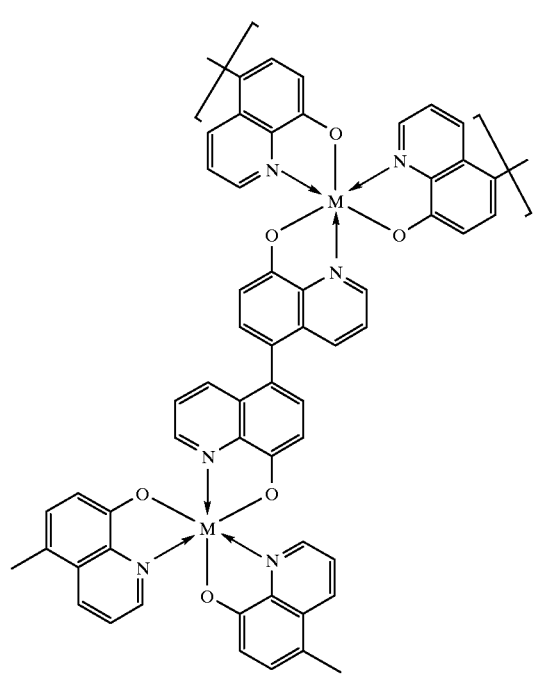

(VI)

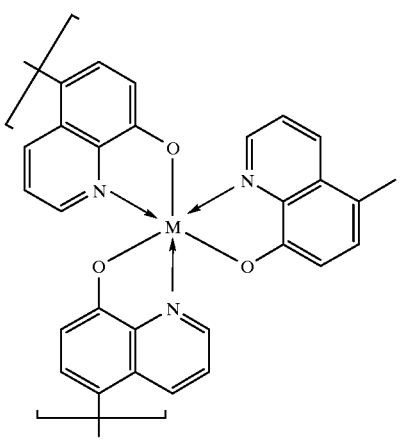

-continued

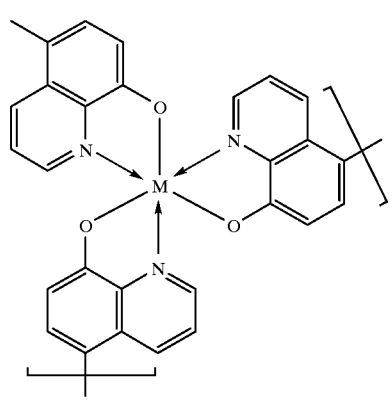

(d) contacting said deposit on said surface with said reactant compound to produce a fresh metallo-functionalized surface on said deposit;
   (e) contacting said metallo-functionalized surface of said deposit with said bisquinoline compound to produce a further deposit of said oligomeric metallo-quinoline chelate; and
   (f) repeating steps (d) and (e) until a desired thickness of said deposits has been attained.

2. A method for producing an ultrathin semiconducting film in accordance with claim 1 wherein the surface of said substrate is exposed to a functional reactant selected from the group consisting of hydroxyl, carboxyl, and amino acid thio compounds which reacts with said surface to develop a reactive functionalized surface with an active group selected from the group consisting of hydroxyl, carboxyl, thio and amino.

3. The method for producing an ultrathin semiconducting film in accordance with claim 1 wherein said chelating metal is selected from the group consisting of aluminum and zinc.

4. The method for producing an ultrathin semiconducting film in accordance with claim 1 wherein said chelating metal reactant compound is dissolved in an organic solvent.

5. The method for producing an ultrathin semiconducting film in accordance with claim 4 wherein said chelating metal reactant compound has the general formula $(CH_3-CH_2)_n M^n$.

6. The method for producing an ultrathin semiconducting film in accordance with claim 1 wherein said chelating metal reactant compound is dissolved in water.

7. The method for producing an ultrathin semiconducting film in accordance with claim 6 wherein said chelating metal reactant compound has the general formula $MX_y$ and wherein X is selected from the group consisting of halogens and carboxyls.

8. The method for producing an ultrathin semiconducting film in accordance with claim 1 wherein said chelating metal reactant compound is dissolved in an organic solvent and comprises a telomer of bisquinoline and having said chelating metal adjacent the ends of the telomer chain.

9. The method for producing an ultrathin semiconducting film in accordance with claim 1 wherein said chelating metal reactant compound is dissolved in an organic solvent and comprises a telomer of quinoline and chelating metal with quinoline molecules at the ends of the telomer chain.

10. The method for producing an ultrathin semiconducting film in accordance with claim 1 wherein the surface of said substrate and thereafter of said deposits is cleaned with solvent between each of said steps to remove excess reactants.

11. The method for producing an ultrathin semiconducting film in accordance with claim 1 wherein said provided substrate has a base and metallic oxide layer thereon and upon which said film is deposited.

12. The method for producing an ultrathin semiconducting film in accordance with claim 11 wherein said metallic oxide layer is doped with a fluorescent dye.

13. The method for producing an ultrathin semiconducting film in accordance with claim 12 wherein said provided substrate also includes a hole transporting layer between said base and said metallic oxide layer.

14. The method for producing an ultrathin semiconducting film in accordance with claim 1 wherein there is included the step of depositing on said film metal to provide one of a conductive layer for use as a diode and spaced stripes for use as a transistor.

15. A semiconducting device including:

(a) a substrate; and (b) an ultrathin semiconducting film comprising elongated chains having a general formula selected from the group consisting of:

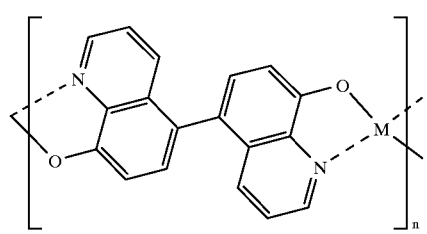

(V)

or

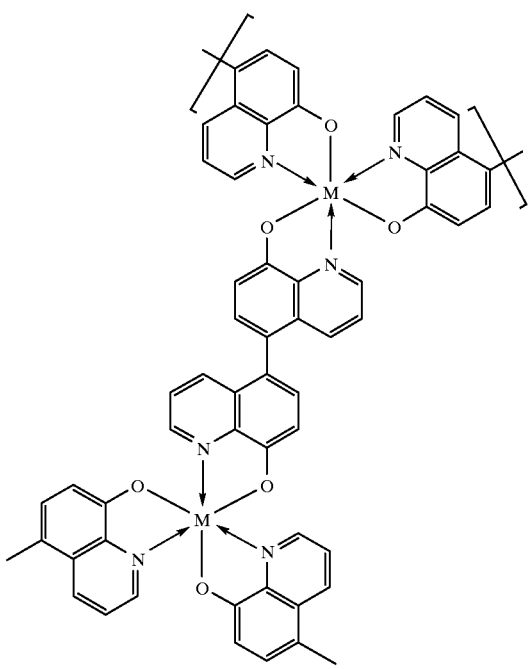

(VI)

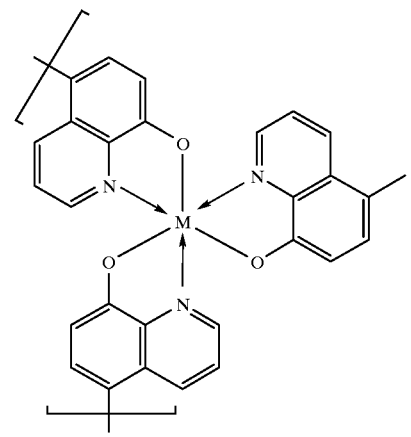

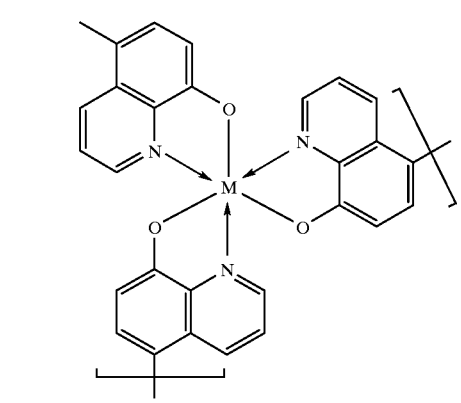

16. The semiconducting device in accordance with claim 15 wherein M is zinc and said general formula is (V).

17. The semiconducting device in accordance with claim 15 wherein M is aluminum and said general formula is (VI).

18. The semiconducting device in accordance with claim 15 wherein most of the length of said chains is in accordance with general formula (V) and a lesser portion of said chains is in accordance with general formula (VI).

19. The semiconducting device in accordance with claim 15 includes a conductive coating on the outer surface of said film.

20. The semiconducting device in accordance with claim 15 wherein a conductive layer is interposed between said substrate and said film.

21. The semiconducting device in accordance with claim 20 wherein a layer doped with fluorescent dye is interposed between said conducting layer and said film.

22. The semiconducting device in accordance with claim 16 wherein there is included above said film one of the group consisting of a conductive metallic layer to provide a diode or spaced stripes of metal to provide a transistor.

* * * * *

UNITED STATES PATENT AND TRADEMARK OFFICE
CERTIFICATE OF CORRECTION

PATENT NO. : 5,946,550
DATED : August 31, 1999
INVENTOR(S) : Fotis Papadimitrakopoulos It is certified that error appears in the above-indentified patent and that said Letters Patent is hereby corrected as shown below:

Column 16, line 47, delete "acid" and insert --and--.

Signed and Sealed this

Twenty-second Day of February, 2000

Attest:

Q. TODD DICKINSON

Attesting Officer

Commissioner of Patents and Trademarks